US012768873B2

(12) United States Patent
Huang et al.

(10) Patent No.: US 12,768,873 B2
(45) Date of Patent: Oct. 20, 2026

(54) COVER OPENING AND CLOSING EQUIPMENT

(71) Applicant: King Yuan Electronics Co., Ltd., Hsin-Chu (TW)

(72) Inventors: Teng Da Huang, Hsin-Chu (TW); Po Han Kuo, Hsin-Chu (TW); Hsung Liang Chang, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 136 days.

(21) Appl. No.: 19/023,202

(22) Filed: Jan. 15, 2025

(65) Prior Publication Data

US 2026/0036616 A1 Feb. 5, 2026

(30) Foreign Application Priority Data

Jul. 31, 2024 (TW) ................................ 113128580

(51) Int. Cl.
*G01R 31/26* (2020.01)

(52) U.S. Cl.
CPC ..... *G01R 31/2601* (2013.01); *G01R 31/2642* (2013.01)

(58) Field of Classification Search
CPC ................ G01R 1/0408; G01R 1/0466; G01R 31/2601; G01R 31/2642; G01R 31/2863; G01R 31/2867
See application file for complete search history.

(56) References Cited

U.S. PATENT DOCUMENTS

| | | | | |
|---|---|---|---|---|
| 8,066,113 B2 * | 11/2011 | Lin | .................... | B65G 47/8884 209/617 |
| 10,254,308 B2 * | 4/2019 | Chen | .................. | H01R 13/6275 |
| 12,479,670 B2 * | 11/2025 | Chen | .................... | B65G 47/905 |
| 2021/0199690 A1 * | 7/2021 | Ouyang | ............... | G01R 1/0466 |

FOREIGN PATENT DOCUMENTS

JP 2003098220 A 4/2003

* cited by examiner

*Primary Examiner* — Vinh P Nguyen
(74) *Attorney, Agent, or Firm* — CKC & Partners Co., LLC

(57) ABSTRACT

A cover opening and closing equipment includes a bottom plate, a guiding structure, at least one socket and a moving device. The guiding structure extends along a direction. The socket includes a base, a cover, a lock and a bendable driving portion. The base is disposed on the bottom plate and accommodates a chip. The cover connects with the base and covers the base. The lock is disposed on the base and snaps with the cover. The bendable driving portion has a first end and a second end. The first end connects with the base and the lock. The second end connects with the guiding structure. The moving device connects and drives the second end to move along the direction relative to the guiding structure, such that the first end rotates relative to the base to make the lock snap with or release the cover.

19 Claims, 11 Drawing Sheets

COVER OPENING AND CLOSING EQUIPMENT

RELATED APPLICATIONS

This application claims priority to Taiwanese Application Serial Number 113128580, filed Jul. 31, 2024, which is herein incorporated by reference in its entirety.

BACKGROUND

Technical Field

The present disclosure relates to cover opening and closing equipment. More particularly, the present disclosure relates to cover opening and closing equipment for making easy the picking up and placement of chips during burn-in tests.

Description of Related Art

As the demand for electronic devices continues to increase nowadays, the quality of various components in an electronic device therefore becomes very important to the industry. Apart from the improvement of manufacturing technology of various components, the quality tests to the components have also become increasingly important.

For example, the purpose of a burn-in test is to provide an environment of high-temperature, high-voltage, and high-current for a device under test, such that the device under test with a relatively short life cycle can behave with its proper characteristics early during the burn-in process. Therefore, how to improve the accuracy of operation and thus reduce the testing cost during a burn-in test is undoubtedly an important issue which the industry highly concerns.

SUMMARY

A technical aspect of the present disclosure is to provide a cover opening and closing equipment, which can increase the success rate of opening or closing a cover and thus reduce the operational cost of testing.

Another technical aspect of the present disclosure is to provide a cover opening and closing equipment, which can be applied to different types of testing sockets, such as the clam-type testing socket and the Z-type testing socket, thereby increasing commonality.

A further technical aspect of the present disclosure is to provide a cover opening and closing equipment, of which the moving device drives the guiding piece of the testing socket to move along a single direction to complete the action of opening or closing the cover of the testing socket, thereby reducing the complexity and the freedom of the action of opening or closing the cover.

According to an embodiment of the present disclosure, a cover opening and closing equipment includes a bottom plate, a guiding structure, at least one testing socket and a moving device. The guiding structure at least partially extends along a first direction. The testing socket includes a base, a cover, a lock and a bendable driving portion. The base is disposed on the bottom plate and configured to accommodate a chip. The cover is elastically and pivotally connected with the base. The cover is configured to cover the base. The lock is disposed on the base and configured to snap with the cover. The bendable driving portion has a first end and a second end opposite to the first end. The first end is pivotally connected with the base and mechanically connected with the lock. The second end is movably connected with the guiding structure. The moving device is configured to connect with and drive the second end to move along the first direction relative to the guiding structure, such that the first end rotates relative to the base to make the lock snap with or release the cover.

In one or more embodiments of the present disclosure, the bendable driving portion includes a shaft, a first connecting rod, a second connecting rod and a guiding piece. The shaft defines the first end and extends along a second direction. The second direction is perpendicular to the first direction. The shaft is connected with an end of the first connecting rod. An end of the second connecting rod is rotatably connected with another end of the first connecting rod. The guiding piece defines the second end and is connected with another end of the second connecting rod.

In one or more embodiments of the present disclosure, the guiding structure includes an upper rail and a lower rail. The upper rail extends along the first direction. The lower rail is at least partially parallel with the upper rail and defines a gap with the upper rail therebetween. The guiding piece at least partially penetrates through the gap.

In one or more embodiments of the present disclosure, the guiding structure further includes at least one sensing unit. The sensing unit is disposed on one of the upper rail and the lower rail. The sensing unit is configured to sense the guiding piece.

In one or more embodiments of the present disclosure, the guiding structure further includes at least one positioning portion. The positioning portion is disposed on the lower rail along the first direction. The positioning portion is elastically connected with the lower rail and configured to provide positioning to the guiding piece.

In one or more embodiments of the present disclosure, the moving device includes a main body and a telescopic arm. The main body is configured to at least partially move along the first direction and the second direction. The telescopic arm is connected with the main body and configured to extend or retract along a third direction to connect with or detach from the guiding piece. The third direction is perpendicular to the first direction and the second direction.

In one or more embodiments of the present disclosure, the telescopic arm is further configured to push the cover to make the cover cover the base.

According to an embodiment of the present disclosure, a cover opening and closing equipment includes a bottom plate, a guiding structure, a supporting structure, at least one testing socket and a moving device. The guiding structure at least partially extends along a first direction. The supporting structure is at least partially parallel with the guiding structure and configured to at least partially move towards the guiding structure. The testing socket is located between the guiding structure and the supporting structure. The testing socket includes a base, a first cover, a second cover and a driving portion. The base is disposed on the bottom plate and configured to accommodate a chip. The first cover is pivotally connected with the base and configured to cover the base. The second cover is pivotally connected with the first cover. The driving portion includes a driving body, a first guiding piece and a second guiding piece. The driving body is pivotally connected with the second cover. The first guiding piece and the second guiding piece are disposed on two opposite sides of the driving body. The first guiding piece is movably connected with the guiding structure. The second guiding piece is movably connected with the supporting structure after the support structure at least partially moves towards the guiding structure. The moving device is configured to connect with the first guiding piece and drive the driving portion to move along the first direction relative to the guiding structure.

In one or more embodiments of the present disclosure, the supporting structure includes a supporting frame and a supporting piece. The supporting piece is movably connected with the supporting frame and configured to move close to or away from the guiding structure relative to the supporting frame. After the supporting piece moves close to the guiding structure relative to the supporting frame, the second guiding piece is allowed to be supported by and move on the supporting piece.

In one or more embodiments of the present disclosure, the first cover and the base form a first included angle therebetween. The second cover and the first cover form a second included angle therebetween. The first included angle and the second included angle face away from each other.

In one or more embodiments of the present disclosure, the guiding structure includes an upper rail and a lower rail. The upper rail extends along the first direction. The lower rail is at least partially parallel with the upper rail and defines a gap with the upper rail therebetween. The first guiding piece at least partially penetrates through the gap.

In one or more embodiments of the present disclosure, the moving device includes a main body and a telescopic arm. The main body is configured to at least partially move along the first direction and a second direction. The telescopic arm is connected with the main body and configured to extend or retract along a third direction to connect with or detach from the first guiding piece. The first direction, the second direction and the third direction are perpendicular to each other.

According to an embodiment of the present disclosure, a cover opening and closing equipment includes a bottom plate, a guiding structure and a moving device. The bottom plate is configured to support a plurality of testing sockets arranged along a first direction. The guiding structure at least partially extends along the first direction. A first guiding piece of each of the testing sockets is movably connected with the guiding structure. The guiding structure is configured to guide a movement of the said first guiding piece along the first direction to open or close a corresponding one of the testing sockets. The moving device is configured to connect with and drive the said first guiding piece to move relative to the guiding structure.

In one or more embodiments of the present disclosure, the guiding structure includes an upper rail and a lower rail. The upper rail extends along the first direction. The lower rail is at least partially parallel with the upper rail and defines a gap with the upper rail therebetween. The said first guiding piece at least partially penetrates through the gap.

In one or more embodiments of the present disclosure, the guiding structure further includes a plurality of sensing units. The sensing units are distributed on one of the upper rail and the lower rail along the first direction. The sensing units are respectively configured to sense a corresponding one of the first guiding pieces.

In one or more embodiments of the present disclosure, the guiding structure further includes a plurality of positioning portions. The positioning portions are distributed on the lower rail along the first direction. The positioning portions are respectively and elastically connected with the lower rail and configured to provide positioning to a corresponding one of the first guiding pieces.

In one or more embodiments of the present disclosure, the moving device includes a main body and a telescopic arm. The main body is configured to at least partially move along the first direction and a second direction. The telescopic arm is connected with the main body and configured to extend or retract along a third direction to connect with or detach from the said first guiding piece. The first direction, the second direction and the third direction are perpendicular to each other.

In one or more embodiments of the present disclosure, the cover opening and closing equipment further includes a supporting structure. The supporting structure at least partially extends along the first direction. The testing sockets are located between the supporting structure and the guiding structure. The supporting structure is configured to at least partially extend towards the guiding structure to support a second guiding piece of a corresponding one of the testing sockets. The said second guiding piece and the said first guiding piece are opposite to each other.

In one or more embodiments of the present disclosure, the supporting structure includes a supporting frame and a supporting piece. The supporting piece is movably connected with the supporting frame and configured to move close to or away from the guiding structure relative to the supporting frame. After the supporting piece moves close to the guiding structure relative to the supporting frame to support the said second guiding piece, the said second guiding piece is allowed to move on the supporting piece along the first direction.

The above-mentioned embodiments of the present disclosure have at least the following advantages: the cover opening and closing equipment is suitable to be used in tests such as the system level testing or the final testing of chips. Moreover, the action of opening or closing a cover by the cover opening and closing equipment can be controlled by the movement of the moving device along a single direction, so as to reduce the complexity and the freedom of the action of opening or closing the cover. In addition, the cover opening and closing equipment is able to open or close a testing socket (including the clam-type testing socket and the Z-type testing socket) in a simple and accurate manner, which facilitates to increase the success rate of opening or closing a cover for placing or picking up a chip. Furthermore, the cover opening and closing equipment can replace the use of manpower to open or close the cover, which can reduce the operational cost of testing.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
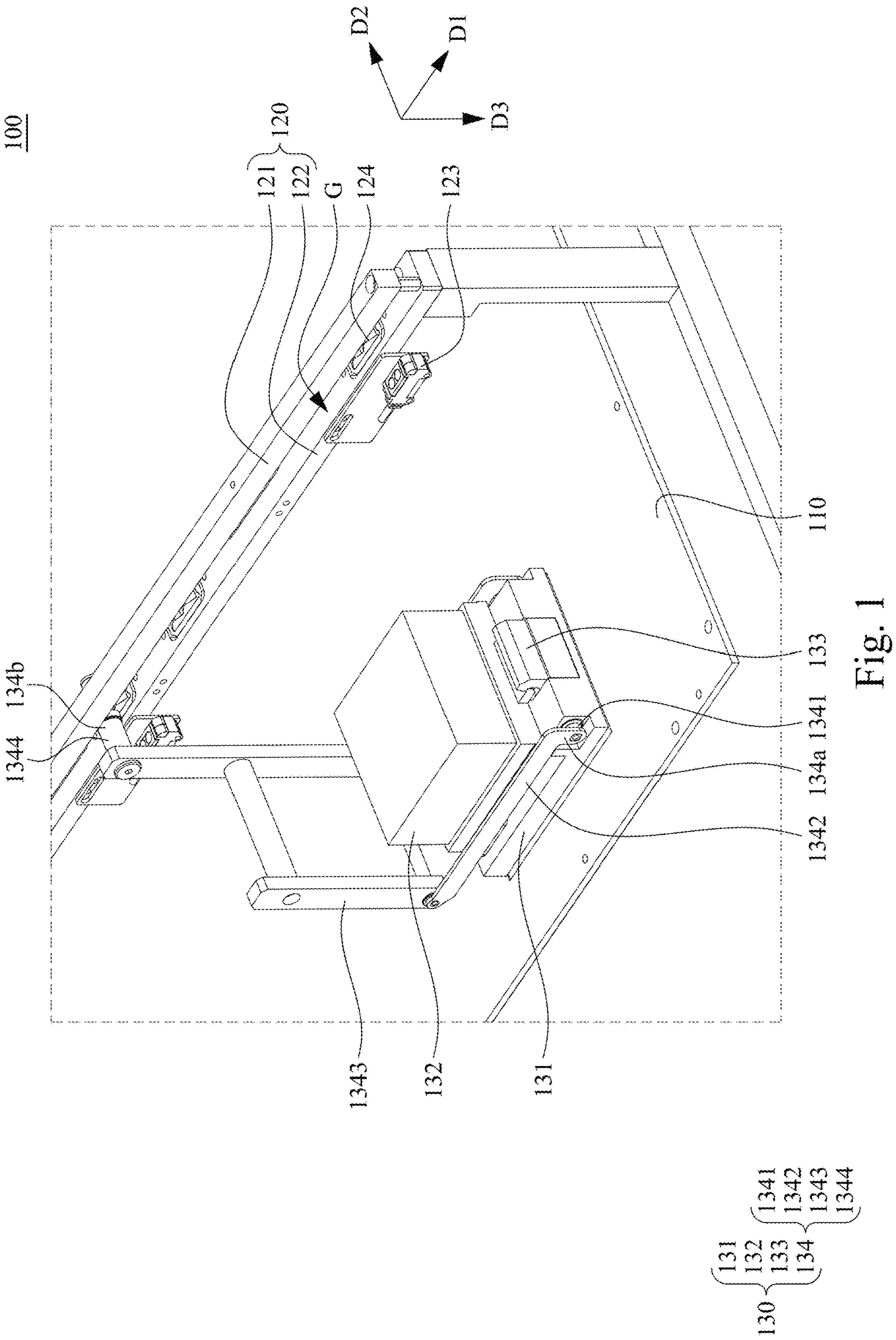
FIG. 1 is a schematic view of a cover opening and closing equipment according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic view of a cover opening and closing equipment 100 according to an embodiment of the present disclosure. In this embodiment, as shown in FIG. 1, a cover opening and closing equipment 100 includes a bottom plate 110, a guiding structure 120 and at least one testing socket 130. In a preferred embodiment, the bottom plate 110 can be a testing circuit board, such as a burn-in circuit board. The guiding structure 120 at least partially extends along a first direction D1. For example, the guiding structure 120 can be disposed on the bottom plate 110, or the bottom plate 110 and the guiding structure 120 are respectively disposed on a frame. The testing socket 130 includes a base 131, a cover 132, a lock 133 and a bendable driving portion 134, and the testing socket 130 is also known as a clam-type testing socket. The base 131 is disposed on the bottom plate 110 and configured to accommodate a chip (not shown), and the chip can be a packaged finished IC or a bare die, etc. The cover 132 is elastically and pivotally connected with the base 131. The cover 132 is configured to cover the base 131. As shown in FIG. 1, the cover 132 is right covering the base 131, so as to sandwich the chip therebetween. The lock 133 is disposed on the base 131 and configured to snap with the cover 132. As shown in FIG. 1, the lock 133 is right snapping with the cover 132, so as to maintain the coverage of the base 131 by the cover 132. The bendable driving portion 134 has a first end 134*a* and a second end 134*b* opposite to the first end 134*a*. The first end 134*a* is pivotally connected with the base 131 and mechanically connected with the lock 133. The first end 134*a* is configured to drive the lock 133 such that the lock 133 snaps with or releases the cover 132. The second end 134*b* is movably connected with the guiding structure 120 along the first direction D1. In a preferred embodiment, the base 131 can be a probe-testing base, which has a plurality of testing probes for testing the chip. Moreover, the cover 132 can include a temperature controlling unit such as a heater or a fan for controlling the burn-in temperature of the chip.

To be more specific, as shown in FIG. 1, the bendable driving portion 134 includes a shaft 1341, a first connecting rod 1342, a second connecting rod 1343 and a guiding piece 1344. The shaft 1341 defines the first end 134*a* mentioned above and extends along a second direction D2. The second direction D2 is perpendicular to the first direction D1. The shaft 1341 is connected with an end of the first connecting rod 1342. An end of the second connecting rod 1343 is rotatably connected with another end of the first connecting rod 1342. The guiding piece 1344 defines the second end 134*b* mentioned above and is connected with another end of the second connecting rod 1343.

Figure 2:
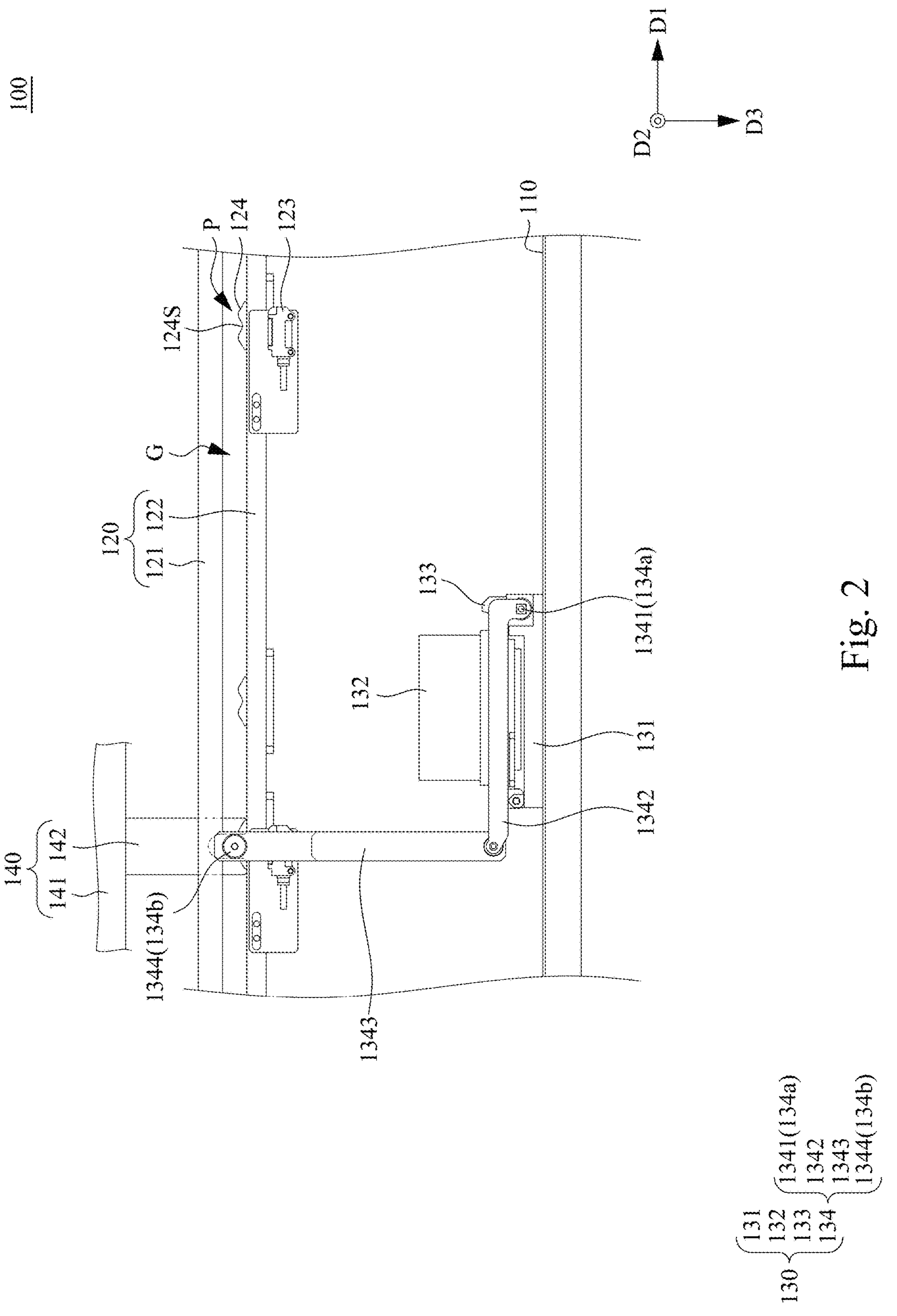
FIG. 2 is a side view of the cover opening and closing equipment of FIG. 1, in which the telescopic arm of the moving device connects with the guiding piece after extending downwards.

Reference is made to FIG. 2. FIG. 2 is a side view of the cover opening and closing equipment 100 of FIG. 1, in which the telescopic arm 142 of the moving device 140 connects with the guiding piece 1344 after extending downwards. In this embodiment, as shown in FIG. 2, the cover opening and closing equipment 100 further includes a moving device 140 (for the sake of drawing simplification, the moving device 140 is not shown in FIG. 1). The moving device 140 is configured to connect with and drive the guiding piece 1344 (i.e., the second end 134*b*) to move along the first direction D1 relative to the guiding structure 120, such that the shaft 1341 (i.e., the first end 134*a*) rotates relative to the base 131, so as to drive the lock 133 to make the lock 133 snap with or release the cover 132.

To be more specific, as shown in FIG. 2, the moving device 140 includes a main body 141 and a telescopic arm 142. The main body 141 is configured to at least partially move along the first direction D1 and the second direction D2. In practice, the first direction D1 and the second direction D2 are both of a horizontal direction. The telescopic arm 142 is connected with the main body 141 and configured to extend or retract along a third direction D3 to connect with or detach from the guiding piece 1344 of the bendable driving portion 134. As shown in FIG. 2, the telescopic arm 142 has already extended downwards and is connecting with the guiding piece 1344. The third direction D3 is perpendicular to the first direction D1 and the second direction D2. In practice, the third direction D3 is of a vertical direction. According to the actual situations, the main body 141 of the moving device 140 can also move along the third direction D3.

Furthermore, as shown in FIG. 2, the guiding structure 120 includes an upper rail 121 and a lower rail 122. The upper rail 121 extends along the first direction D1. The lower rail 122 is at least partially parallel with the upper rail 121 and defines a gap G with the upper rail 121 therebetween. The guiding piece 1344 at least partially penetrates through the gap G under the restriction of the upper rail 121 and the lower rail 122. As driven by the telescopic arm 142, the guiding piece 1344 moves along the first direction D1 in the gap G between the upper rail 121 and the lower rail 122.

Figure 3:
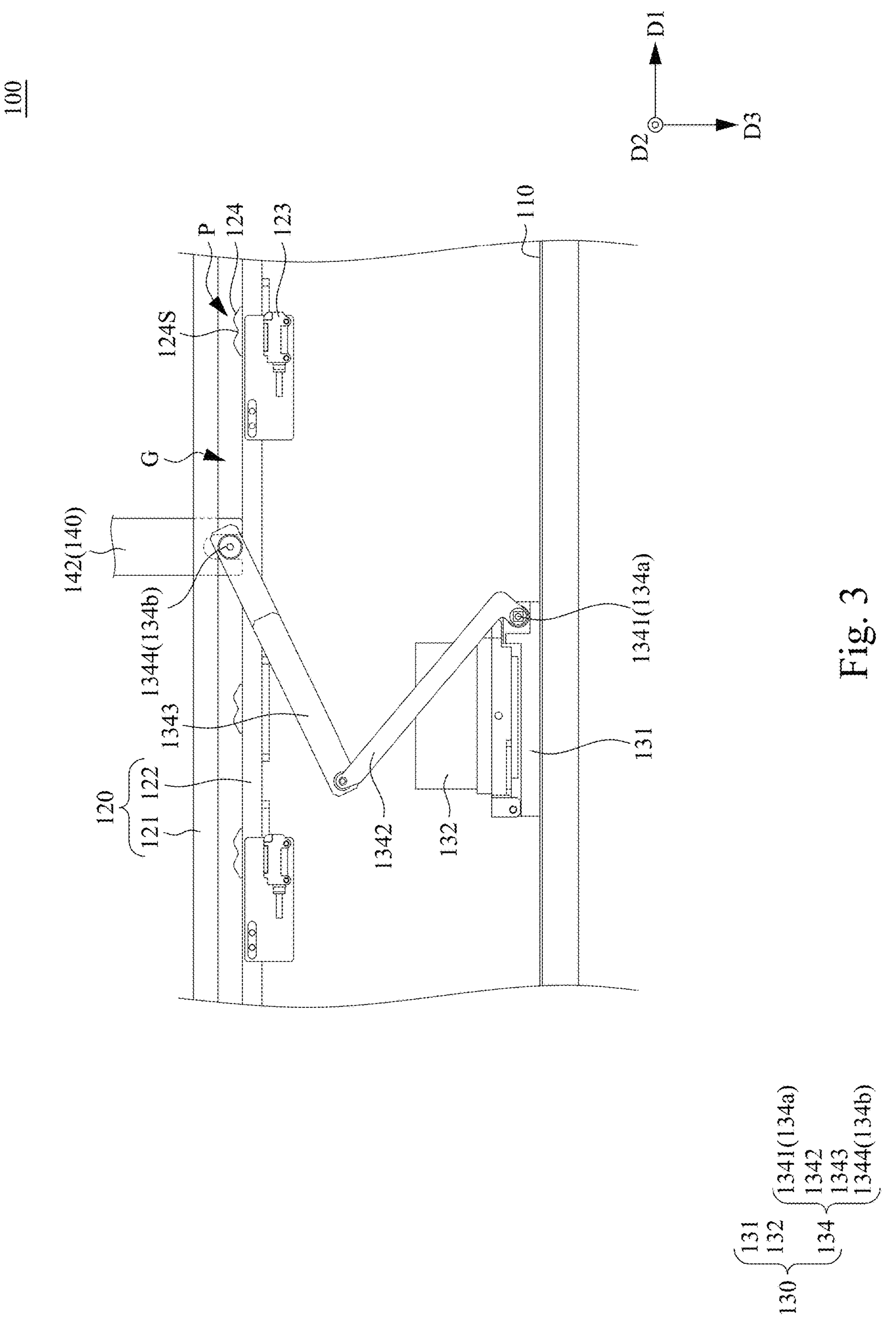
FIGS. 3-5 are flow diagrams showing the opening process of the cover relative to the base of FIG. 2.
Figure 4:
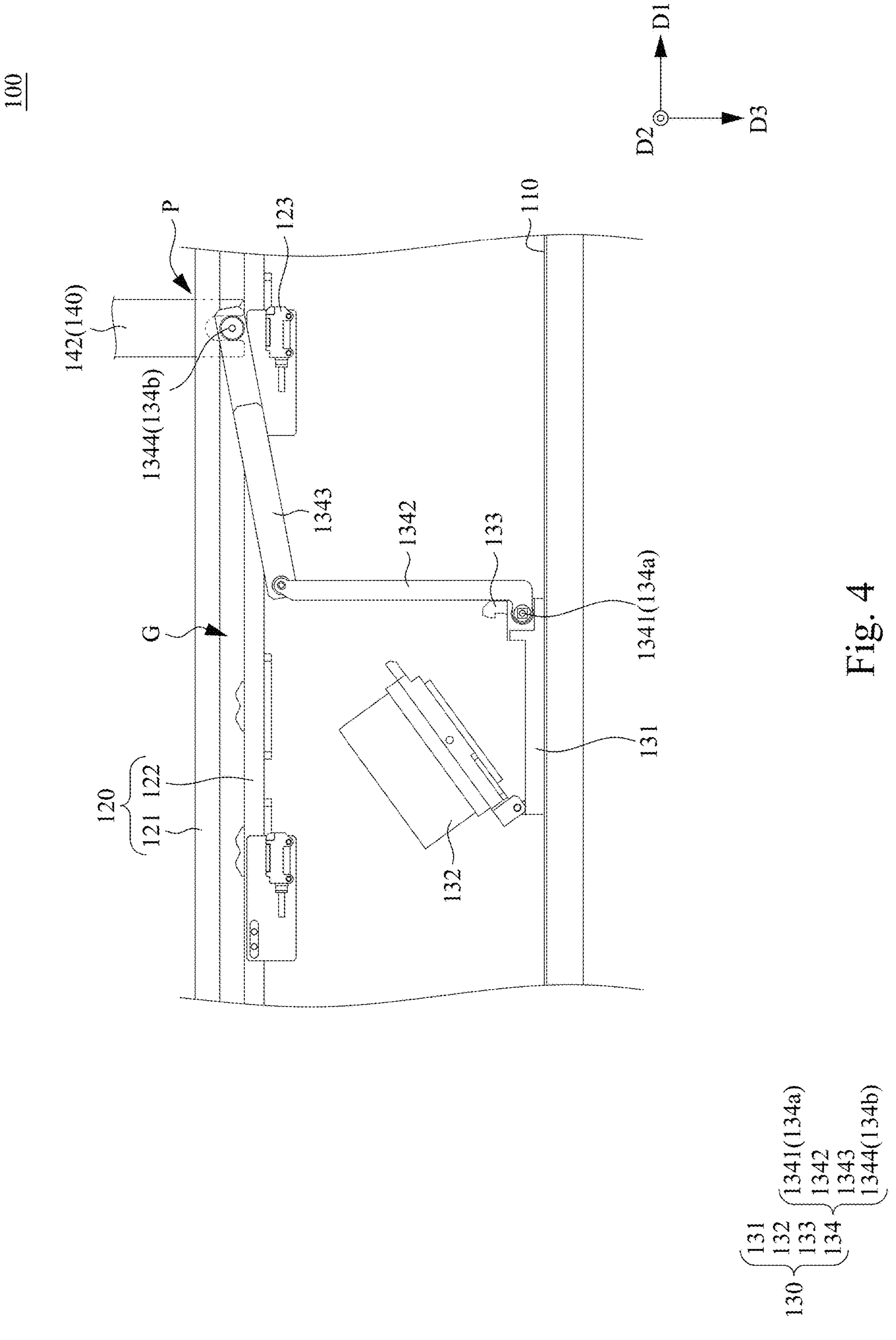
Figure 5:
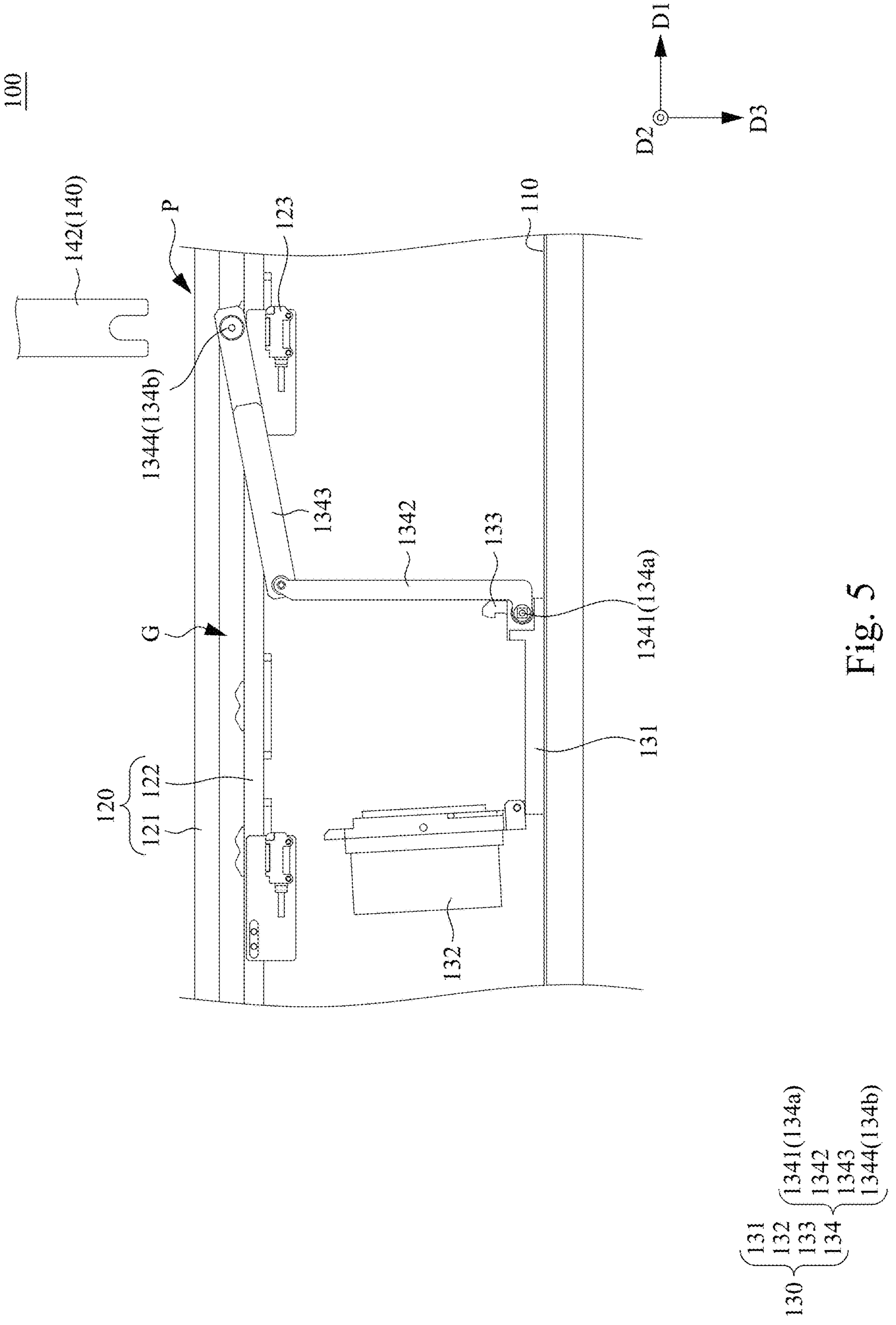

Reference is made to FIGS. 3-5. FIGS. 3-5 are flow diagrams showing the opening process of the cover 132 relative to the base 131 of FIG. 2. For the sake of drawing simplification, the main body 141 of the moving device 140 is not shown in FIGS. 3-5. As shown in FIG. 3, when the telescopic arm 142 keeps driving the guiding piece 1344 to move along the first direction D1 in the gap G, the guiding piece 1344 drives the second connecting rod 1343 to move, and make the first connecting rod 1342 and the shaft 1341 rotate relative to the base 131. As shown in FIG. 4, after the guiding piece 1344 arrives at the target position P, the shaft 1341 has rotated by a certain angle relative to the base 131 to make the lock 133 release the cover 132, and the cover 132 elastically opens relative to the base 131. In practice, the method of the lock 133 snapping with or releasing the cover 132 can be easily accomplished by the specific shapes of the shaft 1341 and the lock 133 with the use of various mechanical components, and is not described in details here. As shown in FIG. 5, the cover 132 is completely opened relative to the base 131. In this condition, the chip can be placed on the base 131 or can be picked up from the base 131. At this point, as shown in FIG. 5, the telescopic arm 142 has already retracted upwards and detached from the guiding piece 1344.

In addition, as shown in FIGS. 1-5, the guiding structure 120 further includes at least one sensing unit 123. The sensing unit 123 is disposed on the lower rail 122 along the first direction D1. The sensing unit 123 is configured to sense the guiding piece 1344. As shown in FIGS. 4-5, the sensing unit 123 corresponds to the target position P. Therefore, when the guiding piece 1344 arrives at the target position P, a user can know from the signal of the sensing unit 123 that the cover 132 has already opened elastically relative to the base 131. Moreover, in practical applications, the sensing unit 123 can be disposed on the upper rail 121 according to the actual situations.

Furthermore, as shown in FIGS. 1-3, the guiding structure 120 further includes at least one positioning portion 124. The positioning portion 124 is disposed on the lower rail 122. The positioning portion 124 is elastically connected with the lower rail 122, and configured to provide positioning to the guiding piece 1344. To be specific, as shown in FIGS. 2-3, the positioning portion 124 at least partially aligns with the sensing unit 123. Moreover, the positioning portion 124 also corresponds to the target position P and has a concave surface 124S. Thus, as shown in FIGS. 4-5, when the guiding piece 1344 arrives at the target position P, the guiding piece 1344 will press on the concave surface 124S of the positioning portion 124 (please see FIGS. 1-3 for the positioning portion 124 since the positioning portion 124 is blocked by the second connecting rod 1343 and the guiding piece 1344 in FIGS. 4-5) and is restricted in position by the concave surface 124S. Hence, the operational accuracy of the cover opening and closing equipment 100 is improved.

Figure 6:
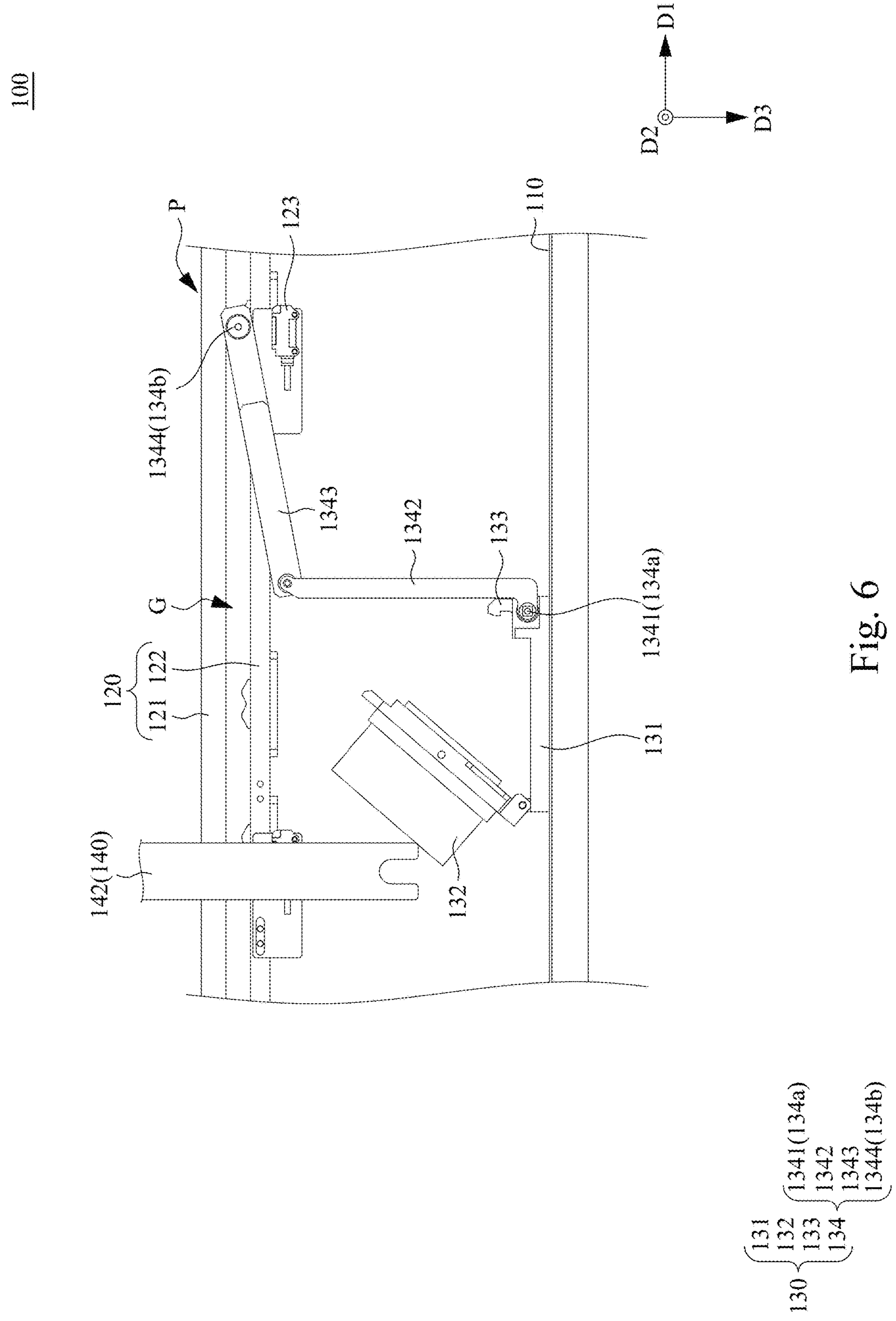
FIGS. 6-7 are flow diagrams showing the process of the cover covering the base of FIG. 5.
Figure 7:
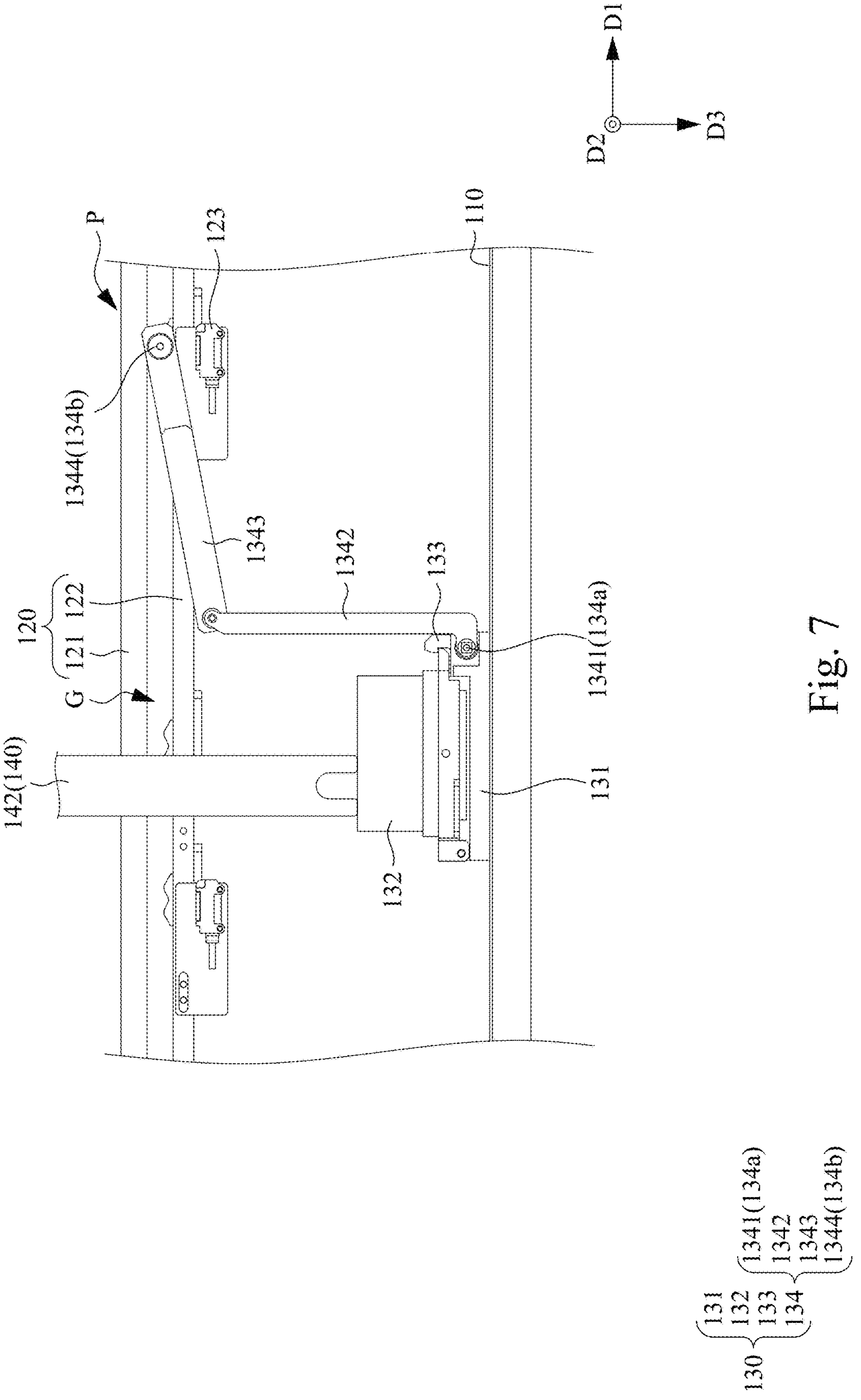

Reference is made to FIGS. 6-7. FIGS. 6-7 are flow diagrams showing the process of the cover 132 covering the base 131 of FIG. 5. During a practical operation, after the chip is placed on the base 131, or the chip is picked up from the base 131, as shown in FIG. 6, the telescopic arm 142 of the moving device 140 is further configured to push the cover 132, such that cover 132 rotates relative to the base 131 to cover the base 131, until the lock 133 snaps with the cover 132, as shown in FIG. 7. At this point, the telescopic arm 142 drives the guiding piece 1344 to move in the gap G towards an opposite direction, and the status of the testing socket 130 is the same as that shown in FIG. 2, until the bendable driving portion 134 recovers back to its original status, as shown in FIG. 1, and the operational process of placing the chip in the testing socket 130 or picking the chip out of the testing socket 130 is completed.

Figure 8:
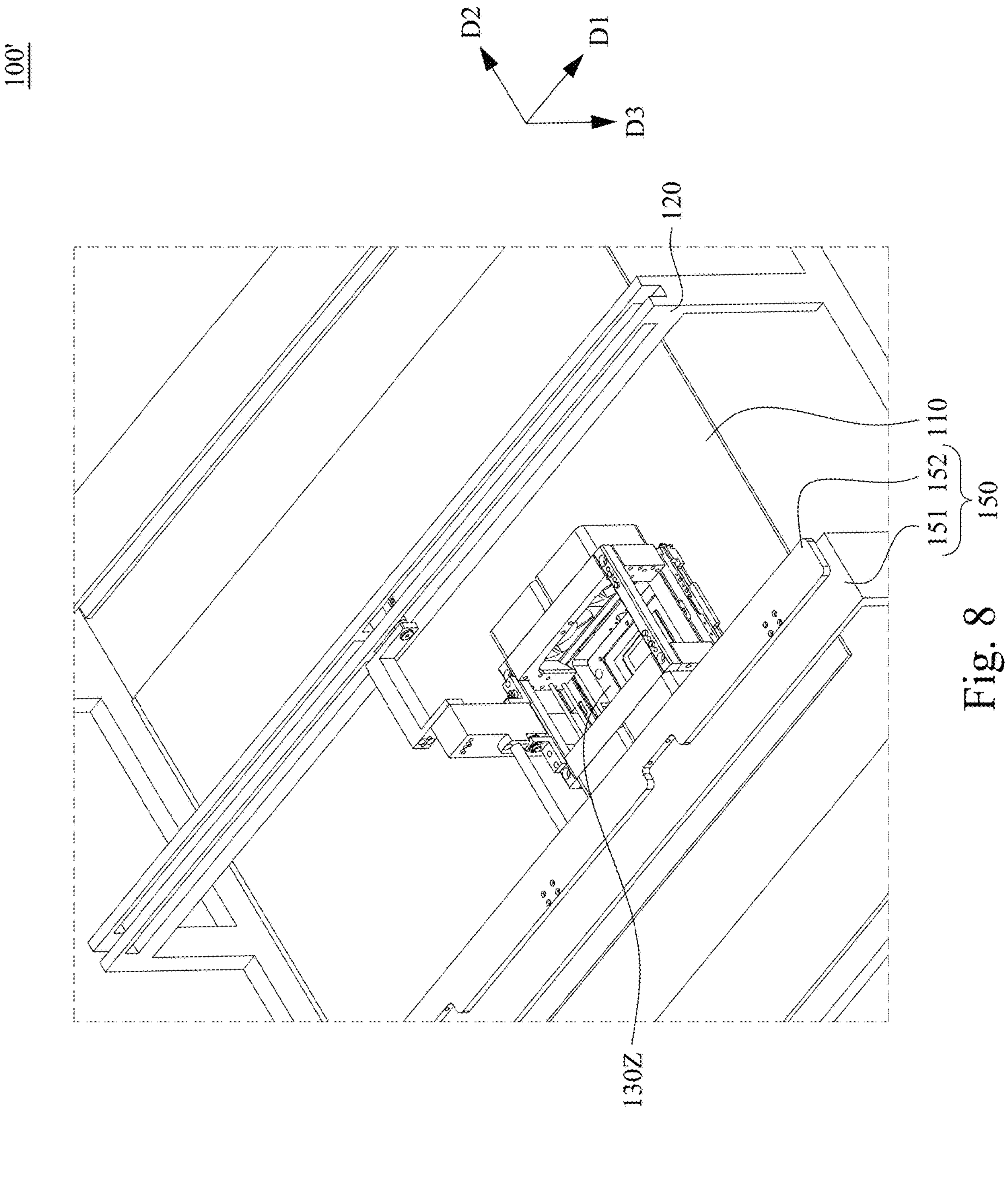
FIG. 8 is a schematic view of a cover opening and closing equipment according to another embodiment of the present disclosure.

Reference is made to FIG. 8. FIG. 8 is a schematic view of a cover opening and closing equipment 100' according to another embodiment of the present disclosure. Being different from the embodiment mentioned above, in this embodiment, as shown in FIG. 8, the cover opening and closing equipment 100' further includes a supporting structure 150, and the type of the testing socket 130Z is also different from the type of the testing socket 130 mentioned in the embodiment above.

Firstly, in this embodiment, as shown in FIG. 8, the supporting structure 150 is at least partially parallel with the guiding structure 120. For example, the supporting structure 150 can be disposed on the bottom plate 110 or on the frame mentioned above. The supporting structure 150 is configured to at least partially move towards the guiding structure 120, while the testing socket 130Z is located between the guiding structure 120 and the supporting structure 150.

To be specific, the supporting structure 150 includes a supporting frame 151 and a supporting piece 152. The supporting frame 151 is connected with the bottom plate 110 or the frame mentioned above. The supporting piece 152 is movably connected with the supporting frame 151 and configured to move close to or away from the guiding structure 120 relative to the supporting frame 151 along the second direction D2. In practice, the method of movement of the supporting piece 152 relative to the supporting frame 151 can be easily accomplished by the use of guiding rails, various mechanical components and/or various telescopic items, and is not described in details here.

Figure 9:
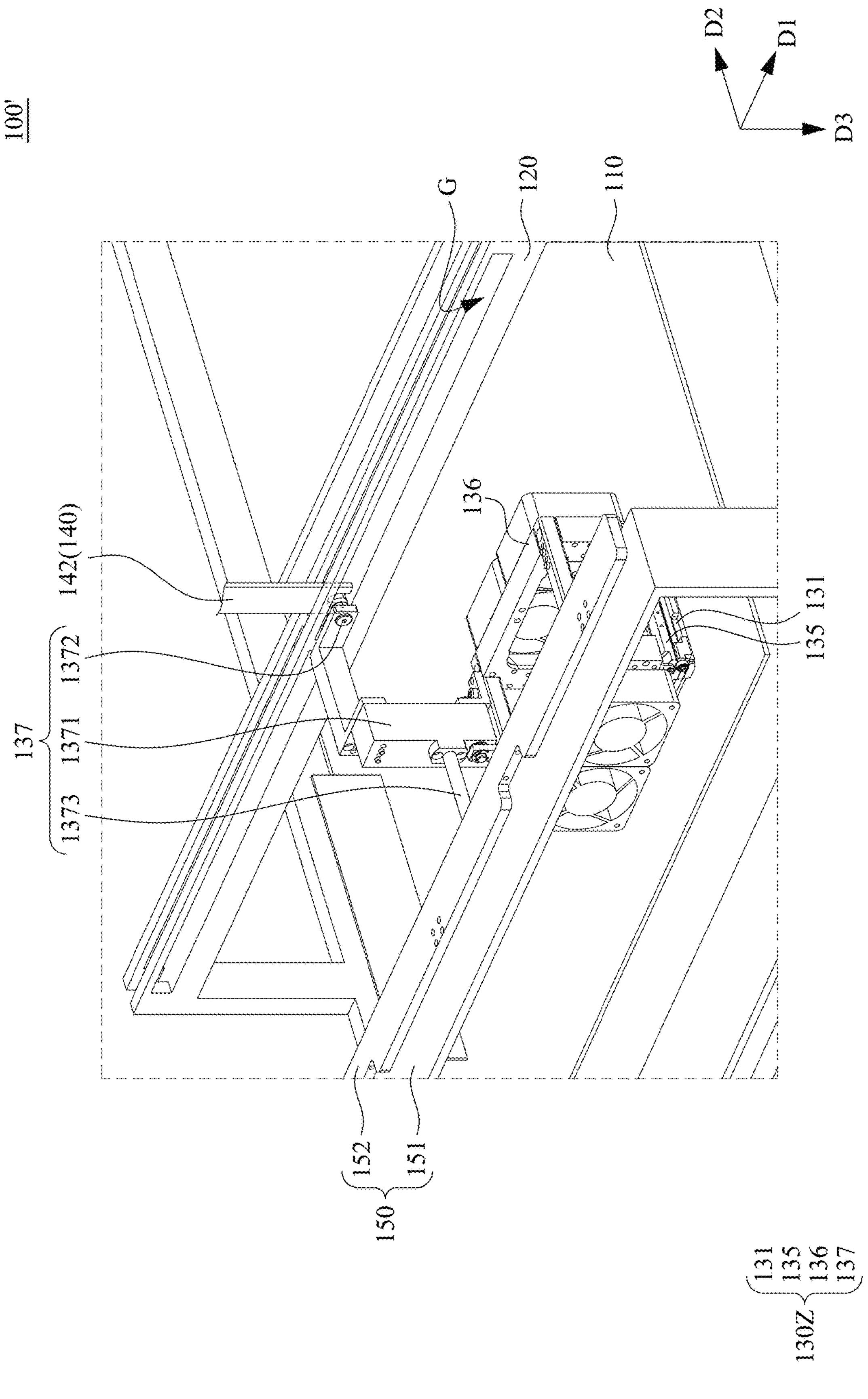
FIG. 9 is a schematic view of the cover opening and closing equipment of FIG. 8, in which the telescopic arm of the moving device connects with the first guiding piece after extending downwards.

Reference is made to FIG. 9. FIG. 9 is a schematic view of the cover opening and closing equipment 100' of FIG. 8, in which the telescopic arm 142 of the moving device 140 connects with the first guiding piece 1372 after extending downwards. In this embodiment, as shown in FIG. 9, the testing socket 130Z includes a base 131, a first cover 135, a second cover 136 and a driving portion 137, and the testing socket 130Z is also known as a Z-type testing socket. The base 131 is disposed on the bottom plate 110 and configured to accommodate a chip (not shown). The first cover 135 is pivotally connected with the base 131 and configured to cover the base 131. The second cover 136 is pivotally connected with the first cover 135. The driving portion 137 includes a driving body 1371, a first guiding piece 1372 and a second guiding piece 1373. The driving body 1371 is pivotally connected with the second cover 136. The first guiding piece 1372 and the second guiding piece 1373 are disposed on two opposite sides of the driving body 1371. The first guiding piece 1372 is movably connected with the guiding structure 120. The second guiding piece 1373 is movably connected with the supporting structure 150 after the supporting structure 150 at least partially moves towards the guiding structure 120. As shown in FIG. 9, the telescopic arm 142 of the moving device 140 has already extended downwards along the third direction D3 and is connecting with the first guiding piece 1372.

Figure 10:
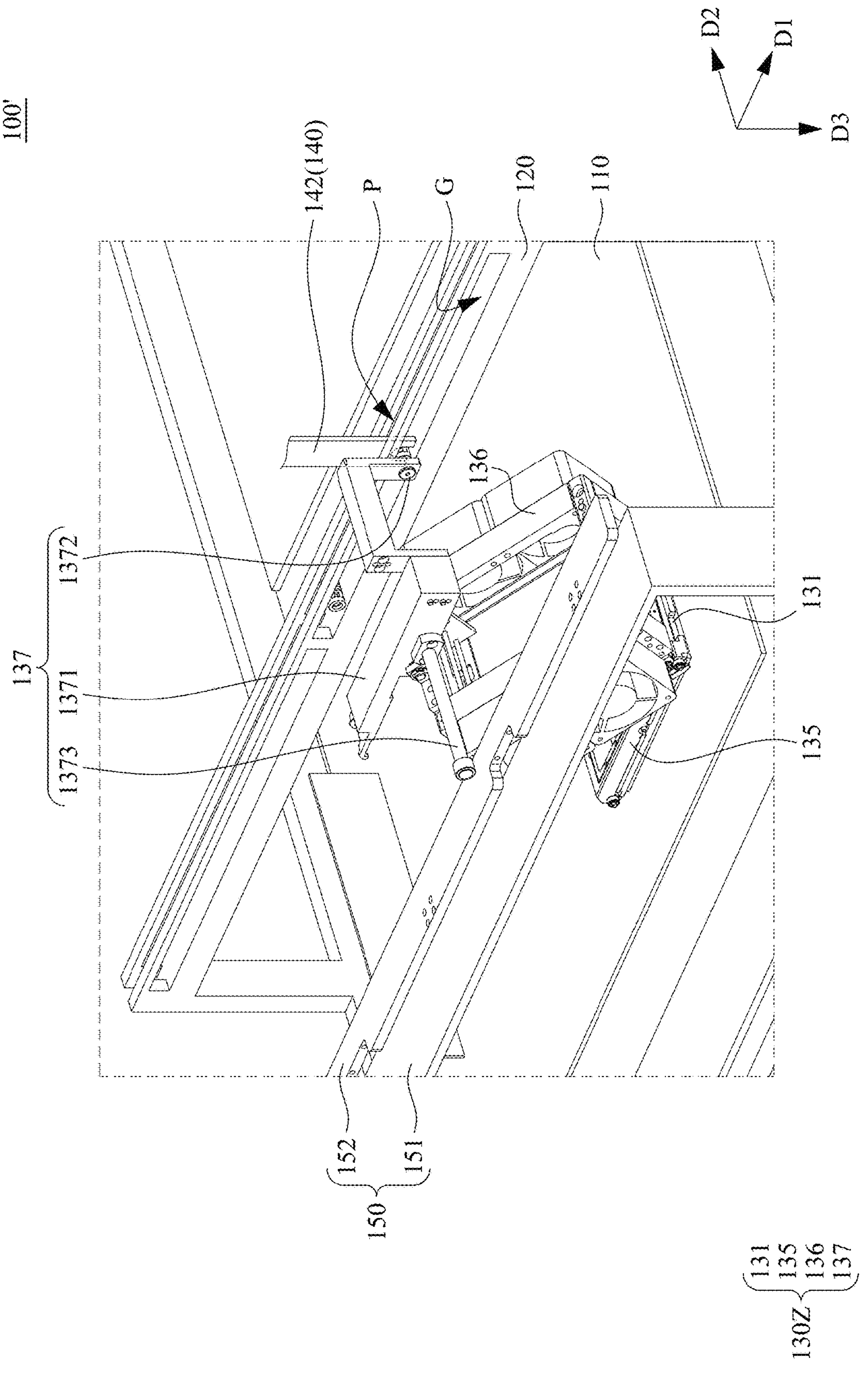
FIG. 10 is a schematic view of the cover opening and closing equipment of FIG. 9, in which the supporting piece moves close to the guiding structure relative to the supporting frame to support the second guiding piece.

Reference is made to FIG. 10. FIG. 10 is a schematic view of the cover opening and closing equipment 100' of FIG. 9, in which the supporting piece 152 moves close to the guiding structure 120 relative to the supporting frame 151 to support the second guiding piece 1373. In this embodiment, as shown in FIG. 10, when the telescopic arm 142 drives the first guiding piece 1372 of the driving portion 137 to move in the gap G of the guiding structure 120 along the first direction D1, the second cover 136 of the testing socket 130Z rotates relative to the first cover 135, and the second guiding piece 1373 of the driving portion 137 correspondingly moves upwards. When the first guiding piece 1372 arrives at the target position P, the second guiding piece 1373 is slightly located higher than the supporting piece 152. At this point, the supporting piece 152 moves close to the guiding structure 120 relative to the supporting frame 151 and the supporting piece 152 is at least partially located below the second guiding piece 1373, such that the second guiding piece 1373 can be supported on the supporting piece 152.

Figure 11:
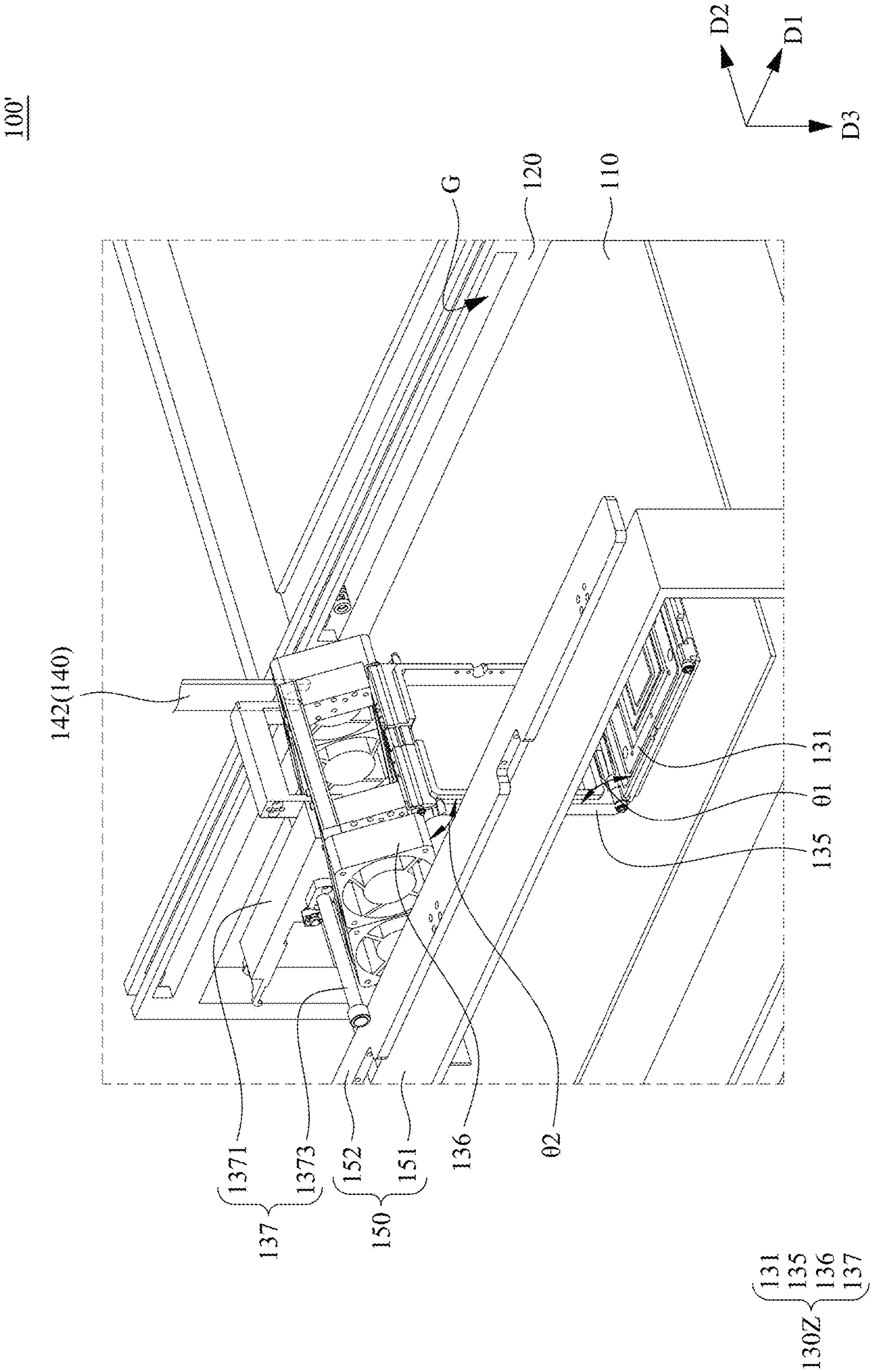
FIG. 11 is a schematic view of the cover opening and closing equipment of FIG. 10, in which the telescopic arm drives the first guiding piece to move towards an opposite direction.

Reference is made to FIG. 11. FIG. 11 is a schematic view of the cover opening and closing equipment 100' of FIG. 10, in which the telescopic arm 142 drives the first guiding piece 1372 to move towards an opposite direction. In this embodiment, as shown in FIG. 11, after the second guiding piece 1373 of the driving portion 137 is supported on the supporting piece 152, the telescopic arm 142 of the moving device 140 drives the first guiding piece 1372 (please see FIGS. 9-10 for the first guiding piece 1372 since the first guiding piece 1372 is blocked by the second cover 136 in FIG. 11) to moves towards an opposite direction to leave from the target position P. Since the second guiding piece 1373 is supported by the supporting piece 152, the first cover 135 rotates relative to the base 131 to expose the base 131. In this condition, the chip can be placed on the base 131 or can be picked up from the base 131.

Furthermore, as shown in FIG. 11, the first cover 135 and the base 131 form a first included angle θ1 therebetween, while the second cover 136 and the first cover 135 form a second included angle θ2 therebetween. In this embodiment, the first included angle θ1 and the second included angle θ2 face away from each other.

Afterwards, during a practical operation, after the chip is placed on the base 131, or the chip is picked up from the base 131, the telescopic arm 142 of the moving device 140 drives the first guiding piece 1372 to move, such that the testing socket 130Z recovers back to the status as shown in FIG. 10. At this point, the supporting piece 152 moves along the second direction D2 away from the guiding structure 120 relative to the supporting frame 151, such that the second guiding piece 1373 of the driving portion 137 is no longer supported on the supporting piece 152. Then, the telescopic arm 142 of the moving device 140 drives again the first guiding piece 1372 to move towards the opposite direction, such that the testing socket 130Z recovers back to the status as shown in FIG. 9, and the operational process of placing the chip in the testing socket 130Z or picking the chip out of the testing socket 130Z is completed.

In conclusion, the aforementioned embodiments of the present disclosure have at least the following advantages: the cover opening and closing equipment is suitable to be used in tests such as the system level testing or the final testing of chips. Moreover, the action of opening or closing a cover by the cover opening and closing equipment can be controlled by the movement of the moving device along a single direction, so as to reduce the complexity and the freedom of the action of opening or closing the cover. In addition, the cover opening and closing equipment is able to open or close a testing socket (including the clam-type testing socket and the Z-type testing socket) in a simple and accurate manner, which facilitates to increase the success rate of opening or closing a cover for placing or picking up a chip. Furthermore, the cover opening and closing equipment can replace the use of manpower to open or close the cover, which can reduce the operational cost of testing.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A cover opening and closing equipment, comprising:
- a bottom plate;
- a guiding structure at least partially extending along a first direction;
- at least one testing socket, comprising:
  - a base disposed on the bottom plate and configured to accommodate a chip;
  - a cover elastically and pivotally connected with the base, the cover being configured to cover the base;
  - a lock disposed on the base and configured to snap with the cover; and
  - a bendable driving portion having a first end and a second end opposite to the first end, the first end being pivotally connected with the base and mechanically connected with the lock, the second end being movably connected with the guiding structure; and
- a moving device configured to connect with and drive the second end to move along the first direction relative to the guiding structure, such that the first end rotates relative to the base to make the lock snap with or release the cover.

2. The cover opening and closing equipment of claim 1, wherein the bendable driving portion comprises:
- a shaft defining the first end and extending along a second direction, the second direction is perpendicular to the first direction;
- a first connecting rod, the shaft is connected with an end of the first connecting rod;
- a second connecting rod, an end of the second connecting rod is rotatably connected with another end of the first connecting rod; and
- a guiding piece defining the second end and connected with another end of the second connecting rod.

3. The cover opening and closing equipment of claim 2, wherein the guiding structure comprises:
- an upper rail extending along the first direction; and
- a lower rail being at least partially parallel with the upper rail and defining a gap with the upper rail therebetween, the guiding piece at least partially penetrates through the gap.

4. The cover opening and closing equipment of claim 3, wherein the guiding structure further comprises:
- at least one sensing unit disposed on one of the upper rail and the lower rail, the sensing unit is configured to sense the guiding piece.

5. The cover opening and closing equipment of claim 3, wherein the guiding structure further comprises:
- at least one positioning portion disposed on the lower rail along the first direction, the positioning portion is elastically connected with the lower rail and configured to provide positioning to the guiding piece.

6. The cover opening and closing equipment of claim 2, wherein the moving device comprises:
- a main body configured to at least partially move along the first direction and the second direction; and
- a telescopic arm connected with the main body and configured to extend or retract along a third direction to connect with or detach from the guiding piece,
- wherein the third direction is perpendicular to the first direction and the second direction.

7. The cover opening and closing equipment of claim 6, wherein the telescopic arm is further configured to push the cover to make the cover cover the base.

8. A cover opening and closing equipment, comprising:

a bottom plate;

a guiding structure at least partially extending along a first direction;

a supporting structure being at least partially parallel with the guiding structure and configured to at least partially move towards the guiding structure;

at least one testing socket located between the guiding structure and the supporting structure, the testing socket comprising:

a base disposed on the bottom plate and configured to accommodate a chip;

a first cover pivotally connected with the base and configured to cover the base;

a second cover pivotally connected with the first cover; and a driving portion comprising a driving body, a first guiding piece and a second guiding piece, the driving body being pivotally connected with the second cover, the first guiding piece and the second guiding piece being disposed on two opposite sides of the driving body, the first guiding piece being movably connected with the guiding structure, wherein the second guiding piece is movably connected with the supporting structure after the support structure at least partially moves towards the guiding structure; and a moving device configured to connect with the first guiding piece and drive the driving portion to move along the first direction relative to the guiding structure.

9. The cover opening and closing equipment of claim 8, wherein the supporting structure comprises:

a supporting frame; and a supporting piece movably connected with the supporting frame and configured to move close to or away from the guiding structure relative to the supporting frame, wherein, after the supporting piece moves close to the guiding structure relative to the supporting frame, the second guiding piece is allowed to be supported by and move on the supporting piece.

10. The cover opening and closing equipment of claim 8, wherein the first cover and the base form a first included angle therebetween, the second cover and the first cover form a second included angle therebetween, the first included angle and the second included angle face away from each other.

11. The cover opening and closing equipment of claim 8, wherein the guiding structure comprises:

an upper rail extending along the first direction; and a lower rail being at least partially parallel with the upper rail and defining a gap with the upper rail therebetween, the first guiding piece at least partially penetrates through the gap.

12. The cover opening and closing equipment of claim 8, wherein the moving device comprises:

a main body configured to at least partially move along the first direction and a second direction; and a telescopic arm connected with the main body and configured to extend or retract along a third direction to connect with or detach from the first guiding piece, wherein the first direction, the second direction and the third direction are perpendicular to each other.

13. A cover opening and closing equipment, comprising:

a bottom plate configured to support a plurality of testing sockets arranged along a first direction;

a guiding structure at least partially extending along the first direction, a first guiding piece of each of the testing sockets being movably connected with the guiding structure, the guiding structure being configured to guide a movement of the said first guiding piece along the first direction to open or close a corresponding one of the testing sockets; and a moving device configured to connect with and drive the said first guiding piece to move relative to the guiding structure.

14. The cover opening and closing equipment of claim 13, wherein the guiding structure comprises:

an upper rail extending along the first direction; and a lower rail being at least partially parallel with the upper rail and defining a gap with the upper rail therebetween, the said first guiding piece at least partially penetrates through the gap.

15. The cover opening and closing equipment of claim 14, wherein the guiding structure further comprises:

a plurality of sensing units distributed on one of the upper rail and the lower rail along the first direction, the sensing units are respectively configured to sense a corresponding one of the first guiding pieces.

16. The cover opening and closing equipment of claim 14, wherein the guiding structure further comprises:

a plurality of positioning portions distributed on the lower rail along the first direction, the positioning portions are respectively and elastically connected with the lower rail and configured to provide positioning to a corresponding one of the first guiding pieces.

17. The cover opening and closing equipment of claim 13, wherein the moving device comprises:

a main body configured to at least partially move along the first direction and a second direction; and a telescopic arm connected with the main body and configured to extend or retract along a third direction to connect with or detach from the said first guiding piece, wherein the first direction, the second direction and the third direction are perpendicular to each other.

18. The cover opening and closing equipment of claim 13, further comprising:

a supporting structure at least partially extending along the first direction, the testing sockets being located between the supporting structure and the guiding structure, the supporting structure being configured to at least partially extend towards the guiding structure to support a second guiding piece of a corresponding one of the testing sockets, the said second guiding piece and the said first guiding piece being opposite to each other.

19. The cover opening and closing equipment of claim 18, wherein the supporting structure comprises:

a supporting frame; and a supporting piece movably connected with the supporting frame and configured to move close to or away from the guiding structure relative to the supporting frame, wherein, after the supporting piece moves close to the guiding structure relative to the supporting frame to support the said second guiding piece, the said second guiding piece is allowed to move on the supporting piece along the first direction.

* * * * *